(12) United States Patent
Yoon

(10) Patent No.: US 6,589,831 B2
(45) Date of Patent: Jul. 8, 2003

(54) TRANSISTOR STRUCTURE USING EPITAXIAL LAYERS AND MANUFACTURING METHOD THEREOF

(75) Inventor: Jae-Man Yoon, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/224,421

(22) Filed: Aug. 21, 2002

(65) Prior Publication Data

US 2003/0107063 A1 Jun. 12, 2003

Related U.S. Application Data

(62) Division of application No. 10/012,570, filed on Dec. 12, 2001.

(51) Int. Cl.[7] .......................................... H01L 21/8234
(52) U.S. Cl. ...................... 438/197; 438/300; 257/288
(58) Field of Search ................................ 257/288, 382, 257/408, 330; 437/40; 438/300, 301, 257, 149

(56) References Cited

U.S. PATENT DOCUMENTS

| | | | |
|---|---|---|---|
| 5,716,861 A | * | 2/1998 | Moslehi ........................ 437/40 |
| 5,869,359 A | | 2/1999 | Prabhakar |
| 5,945,707 A | | 8/1999 | Bronner et al. |
| 5,970,352 A | | 10/1999 | Shiozawa et al. |
| 6,160,299 A | | 12/2000 | Rodder |
| 6,232,641 B1 | | 5/2001 | Miyano et al. |
| 6,399,450 B1 | | 6/2002 | Yu |
| 6,403,419 B1 | | 6/2002 | Kim et al. |
| 6,403,434 B1 | * | 6/2002 | Yu .............................. 438/300 |

OTHER PUBLICATIONS

Park et al. (US patent Application Publication US 2002/0142551).*
Kamata et al. (U.S. patent Application Publication US 2002/0063299 A1).

* cited by examiner

Primary Examiner—David Nelms
Assistant Examiner—Thinh T. Nguyen
(74) Attorney, Agent, or Firm—Volentine Francos, PLLC

(57) ABSTRACT

First and second epitaxial layers are spaced apart from one another over the surface of a semiconductor substrate. A gate electrode is formed over the surface of the substrate, and extends within a gap defined between the first and second epitaxial layers and partially overlaps each of the first and second epitaxial layers adjacent the gap. First and second impurity regions are contained at least partially within the first and second epitaxial layers, respectively, and a gate insulating layer is located between the gate electrode and the semiconductor substrate. A non-planar channel region may be defined within the portions of the first and second epitaxial layers which are overlapped by the gate electrode and within a surface portion the semiconductor substrate located between the first and second epitaxial layers.

8 Claims, 6 Drawing Sheets

TRANSISTOR STRUCTURE USING EPITAXIAL LAYERS AND MANUFACTURING METHOD THEREOF

CROSS-REFERENCE TO RELATED APPLICATIONS

This is a divisional of application Ser. No. 10/012,570, filed Dec. 12, 2001, which is incorporated herein by reference in its entirety.

BACKGROUND OF THE INVENTION

1. Field of the Invention

This invention generally relates to semiconductor device structures and manufacturing methods thereof, and more particularly, this invention relates to semiconductor devices having non-planar channel structures which increase the channel lengths thereof, and to methods of manufacturing such devices.

2. Description of Related Art

Semiconductor devices such as field effect transistors (FETs) are becoming increasingly important in low power applications. As FET devices are scaled to smaller and smaller dimensions, manufacturers must refine transistor designs to maintain optimum device performance.

A conventional transistor structure and manufacturing method thereof will be described below with reference to FIG. 1.

Referring to FIG. 1, a device isolation layer is formed on a predetermined region of a silicon substrate 10, and then a gate oxide layer 12 and a gate electrode 16 are formed on the silicon substrate 10. Next, an oxide or a nitride spacer 18 is formed on the sides of the gate electrode 16, and then, ion implantation is performed such that source/drain regions 20 having a lightly doped drain (LDD) configuration are formed.

As the integration of semiconductor devices increases, it becomes necessary to reduce the size of the transistors of such devices. For example, in conventional memory cell designs that use planar transistors, such as the device shown in FIG. 1, the cell size is minimized by scaling lithographic features F, where F is the minimum line width of the feature size that can be patterned with lithography. Accordingly, if a minimum cell size is to be obtained, it is necessary to reduce the size of the transistor as much as possible. This, in turn, reduces the channel length of the device.

However, when the channel length is decreased, performance degradations occur in the device. Electrical characteristics of the device, such as hot-carrier injection, drain leakage current, and punch through become poor. For a memory cell including such a device, data retention time decreases and power consumption increases due to the resultant short channel effects.

SUMMARY OF THE INVENTION

The present invention is at least partially characterized by a transistor having a non-planar channel structure in which epitaxial layers are used to form elevated source and drain regions over a silicon subtrate, and by a method of manufacturing such a transistor.

According to one aspect of the present invention, a semiconductor device includes a semiconductor substrate having a surface, and first and second epitaxial layers spaced apart from one another over the surface of a semiconductor substrate. A gate electrode is formed over the surface of the-substrate, and extends within a gap defined between the first and second epitaxial layers and partially overlaps each of the first and second epitaxial layers adjacent the gap. First and second impurity regions are contained at least partially within the first and second epitaxial layers, respectively, and a gate insulating layer is located between the gate electrode and the semiconductor substrate.

According to another aspect of the present invention, a method of manufacturing a semiconductor device includes selectively growing first and second epitaxial layers over a surface of a semiconductor substrate, forming a gate insulating layer over at least a portion of the first and second epitaxial layers and the surface of the semiconductor substrate, forming a gate electrode over the gate insulating layer such that the gate electrode extends within a gap defined between the first and second epitaxial layers and partially overlaps each of the first and second epitaxial layers adjacent the gap, and forming first and second impurity regions within the first and second epitaxial layers, respectively.

According to the invention, a non-planar channel region may be defined within the portions of the first and second epitaxial layers which are overlapped by the gate electrode and within a surface portion the semiconductor substrate located between the first and second epitaxial layers.

BRIEF DESCRIPTION OF THE DRAWINGS

These and other features, and advantages, of the present invention will be more clearly understood from the following detailed description taken in conjunction with the accompanying drawings. It is important to point out that the illustrations may not necessarily be drawn to scale, and that there may be other embodiments of this invention that are not specifically illustrated but which will still fall under the scope of the present invention.

DETAILED DESCRIPTION OF PREFERRED EMBODIMENTS

Hereinafter, embodiments of the present invention will be described in detail with reference to accompanying drawings.

FIGS. 2A through 2J are sectional views of a device illustrating a method of manufacturing a transistor of a semiconductor device according to an embodiment of the present invention.

Figure 1:
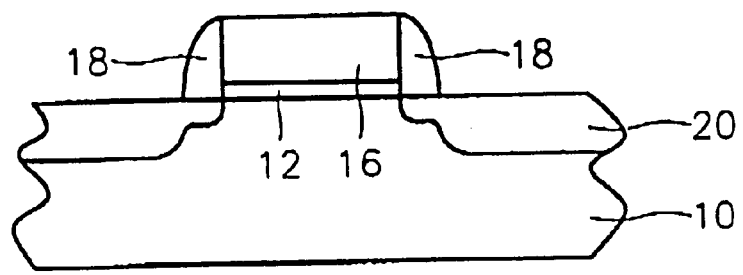
FIG. 1 shows a conventional transistor structure.
Figure 2A:
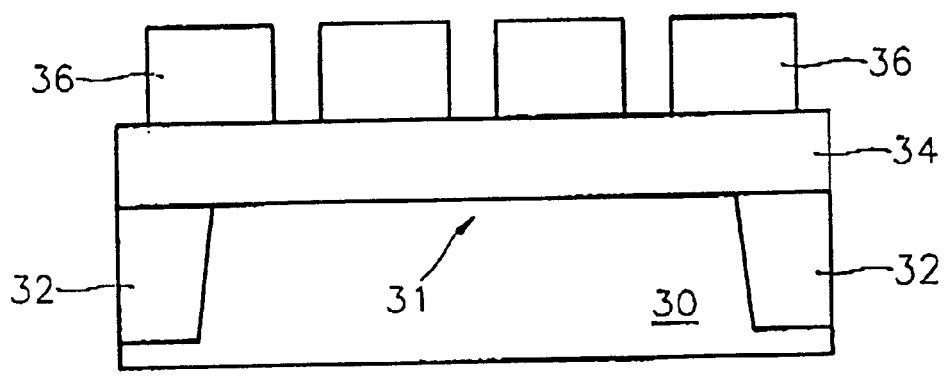
FIGS. 2A–2J are sectional views illustrating a method of manufacturing a semiconductor device in accordance with one or more principles of the present invention.
Figure 2B:
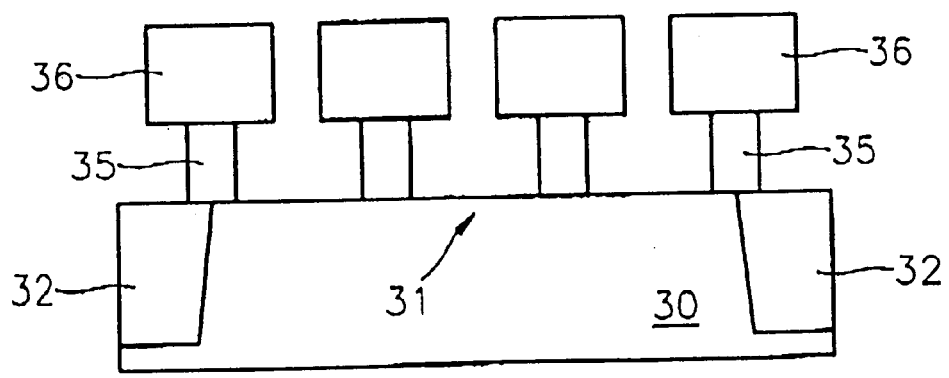
Figure 2C:
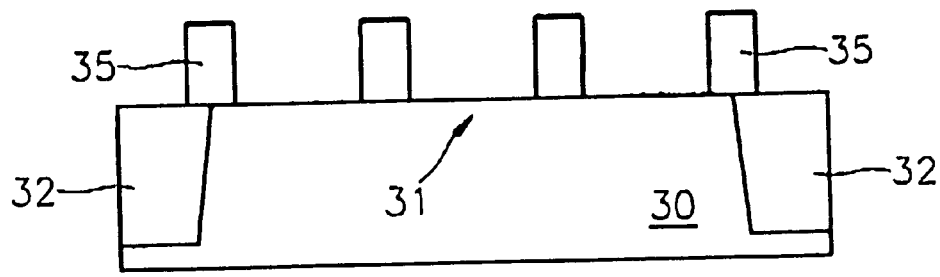

Referring to FIGS. 2A through 2C, a device isolation layer is formed on a silicon substrate 30, thereby defining an active region 31 and a field region 32. Then, a sacrificial oxide layer 34 is deposited on the silicon substrate 30. The sacrificial oxide layer 34 may be formed of tetraethylorthosilicate (TEOS). Si growth should not occur on the sacrificial oxide layer 34 during a subsequent selective epitaxial growth (SEG) process, and the etch rate of the sacrificial oxide layer 34 should be greater than a high density plasma (HDP) oxide layer used for the device isolation layer.

Next, a photoresistive pattern 36 is formed by a photolithographic process on the sacrificial oxide layer 34. Part of the sacrificial oxide layer 34 in the active region 31 on the silicon substrate 30 is etched by using the photoresistive pattern 36 as a mask, thereby forming a sacrificial oxide layer pattern 35. In order to form the sacrificial oxide layer pattern 35, both dry etching and wet etching methods may be used, but damage during dry etching occurs on the surface of the active region 31 on which epitaxial Si layers are to be grown. Therefore, it is preferable that the sacrificial oxide layer pattern 35 is formed using wet etching.

Then, as shown in FIG. 2C, the sacrificial oxide layer pattern 35 is successively formed on the silicon substrate by removing the photoresistive pattern 36 with a photoresistive strip process.

Figure 2D:
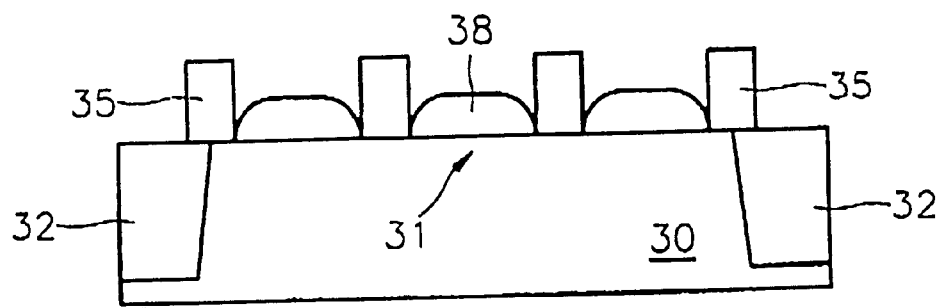

Referring to FIG. 2D, an epitaxial silicon layer 38 is selectively grown on the exposed portion of the active region 31 on the silicon substrate 30 by a low pressure chemical vapor deposition (LPCVD) method. In the selective epitaxial growth (SEG) process, epitaxial silicon layers should not be grown on the sacrificial oxide layer pattern 35 formed on the silicon substrate 30, and on the oxide layer of an isolation region 32.

Figure 3A:
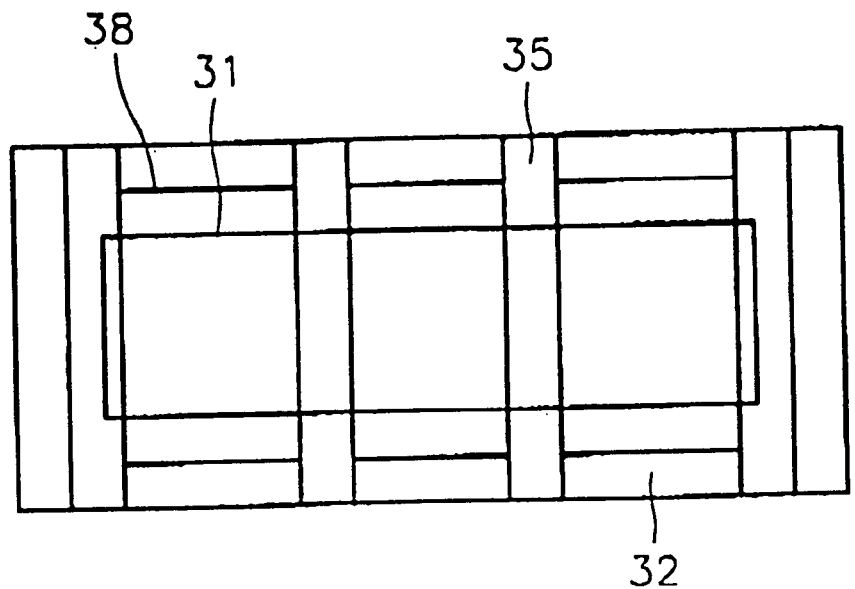
FIGS. 3A–3B show a top level layout view of the semiconductor device illustrated in FIGS. 2A–2J.

FIG. 3A shows a top view of a layout of the semiconductor substrate of FIG. 2D. As shown in FIG. 3A, an epitaxial lateral overgrowth (ELO) phenomenon occurs during the SEG process such that epitaxial layer grows vertically and laterally. Therefore, even though the epitaxial layers 38 should be selectively grown only on the selected portions of the active region 31, they extend to the field region 32. However, the epitaxial layers 38 should not make contact with other epitaxial layers 38 in an adjacent active region 31. Thus, the thickness of the epitaxial layers 38 is determined in consideration of an interval spacing between adjacent active regions 31 and controlled by the design rule of the device.

Figure 2E:
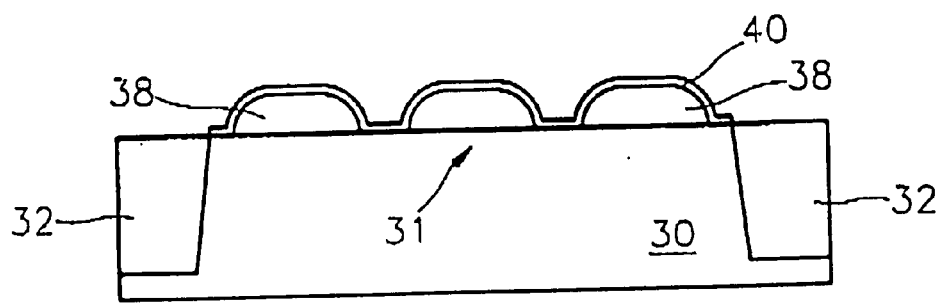

Referring to FIG. 2E, the sacrificial oxide layer pattern 35 is removed by a wet cleaning process. When removing the sacrificial oxide layer pattern 35, etching of a field oxide layer 32 is minimized by using wet cleaning conditions having a high etching selectivity with respect to the oxide layer of the field region 32. Then, a gate oxide layer 40 is deposited on the exposed silicon substrate 30 and epitaxial layers 38 as a thermal oxide layer of a metal-oxide-silicon field effect transistor (MOSFET).

Figure 2F:
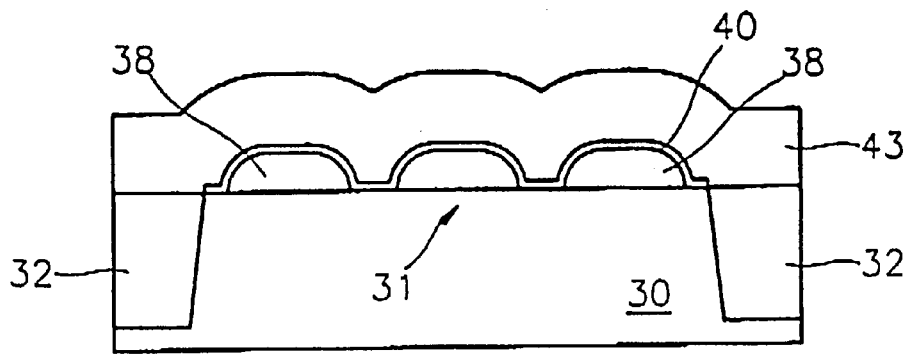

Referring to FIG. 2F, a gate electrode layer 43 of the MOSFET is formed on the gate oxide layer 40. The gate electrode layer 43 is formed of doped polysilicon.

Figure 2G:
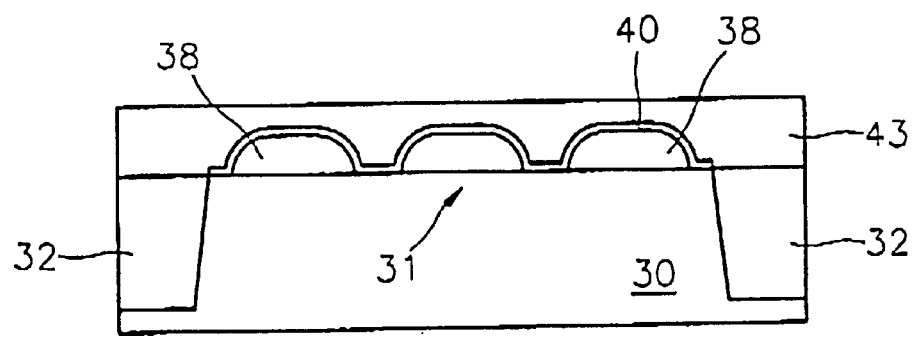

Referring to FIG. 2G, the surface of the gate electrode layer 43 is planarized by a chemical mechanical polishing (CMP) process. In order to obtain the margin of a depth of focus (DOF) when forming a subsequent gate electrode pattern, a curved portion of the gate electrode layer 43 is removed using the CMP process.

Figure 2H:
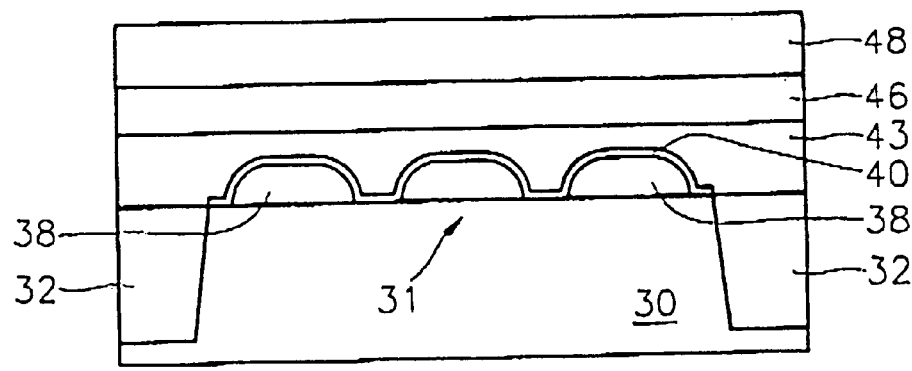

Referring to FIG. 2H, a conductive layer 46 having low resistance, for example a metal such as tungsten (W), WSix, or CoSix, is deposited on the gate electrode layer 43. Next, an insulating layer 48, for example, SiN, a high temperature oxide (HTO), or a high density plasma (HDP) oxide is deposited on the conductive layer 46 to be used as a hard mask in a subsequent process of forming a pattern.

Figure 2I:
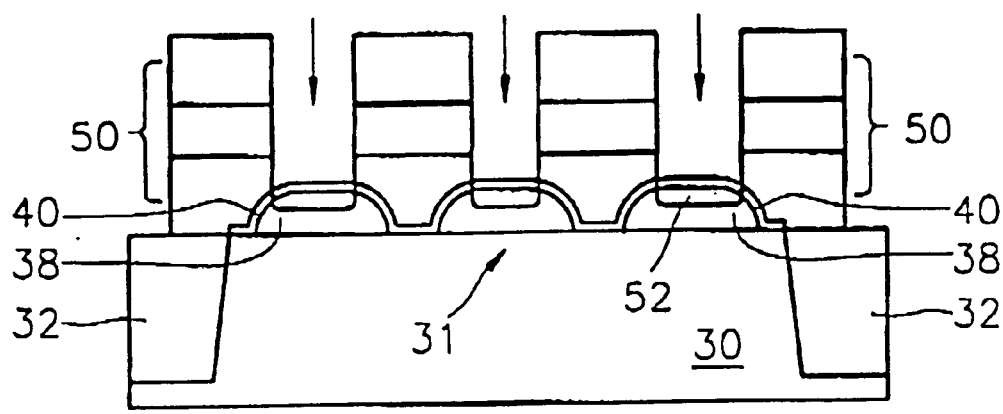

Referring to FIG. 2I, a gate pattern 50 comprising the gate oxide layer 40, the gate polysilicon layer 43, the low resistance conductive layer 46, and the mask insulating layer 48, is formed in a stacked pattern on the silicon substrate 30 by a photolithographic process.

Also as shown in FIG. 2I, source/drain doping layers are formed by implanting a low concentration of impurity ions in the epitaxial layers 38, which are exposed to both sides of the gate pattern 50.

Figure 3B:
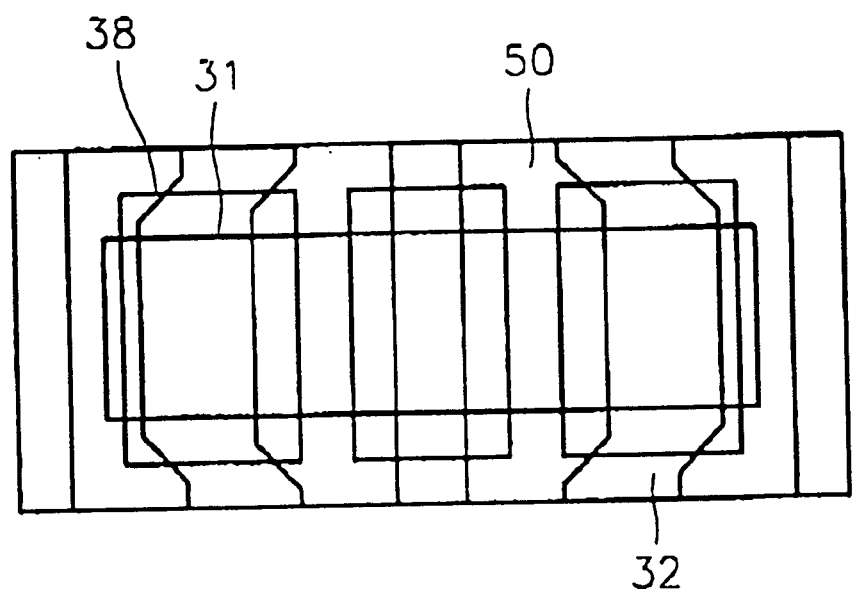

As can be seen in FIG. 3B, the epitaxial layers 38 overlap parts of the gate electrodes 43 and the field region 32.

Figure 2J:
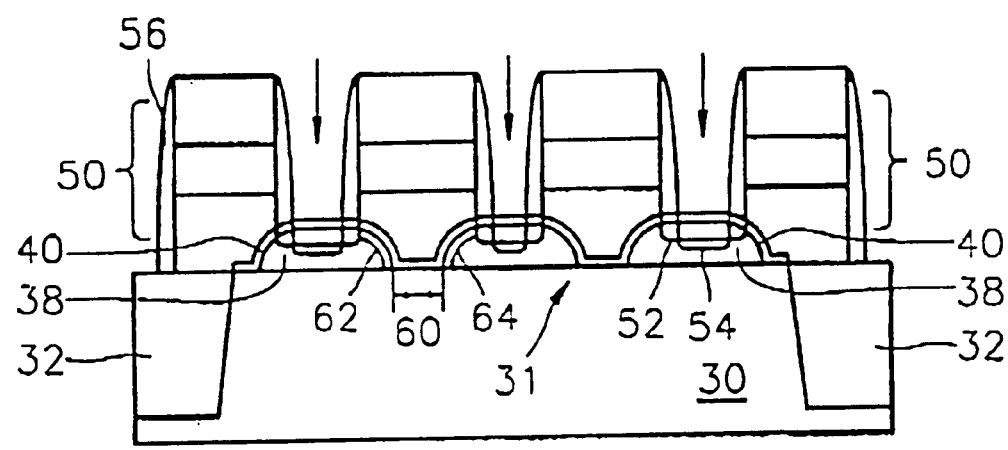

Referring to FIG. 2J, an insulating layer of SiN or HTO is deposited on the entire surface of the silicon substrate 30, and then etched to form sidewalls or spacers 56 on both sides of the gate pattern 50. Next, the source/drain junctions 54 are formed by implanting a high concentration of impurity ions, thereby completing the MOSFET. In the case of an N-MOSFET, a doping layer having a high concentration is formed on the surface of the epitaxial silicon layer by using doses of arsenic (As) at a concentration $1 \times 10^{15}$ through $5 \times 10^{15}$ at an energy of 5–30 KeV. In case of a P-MOSFET, the doping layer is formed on the surface of the epitaxial silicon layer by using doses of boron difluoride (BF2) or boron (B) a concentration $1 \times 10^{15}$ through $5 \times 10^{15}$ at an energy of 10–30 KeV.

Figure 4A:
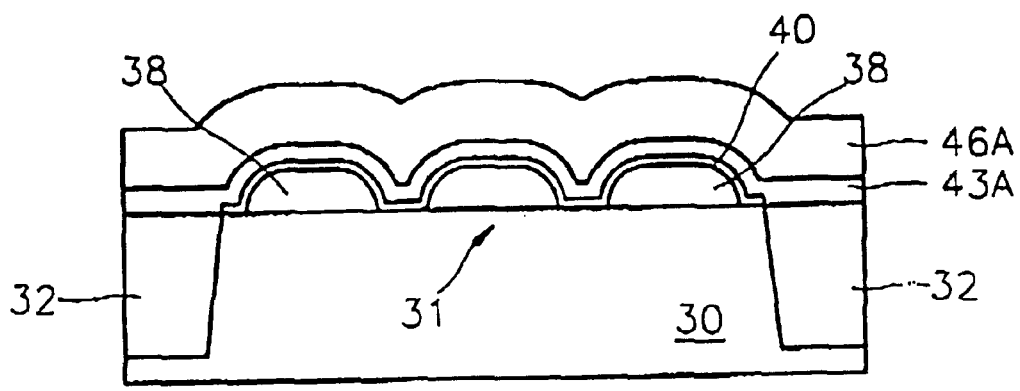
FIGS. 4A–4B are cross-section views illustrating another method of manufacturing a semiconductor device in accordance with one or more principles of the present invention.
Figure 4B:
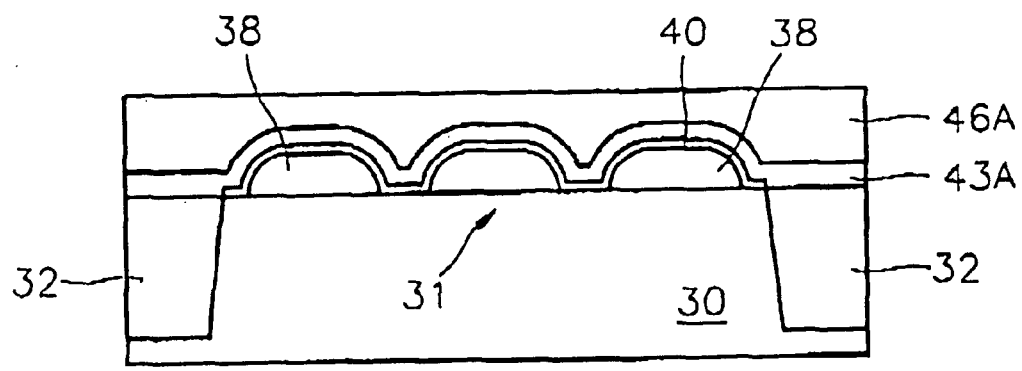

FIGS. 4A–4B are sectional views of a device illustrating another method of manufacturing a transistor of a semiconductor device in accordance with one or more principles of the present invention. The steps shown above with respect to FIGS. 2A through 2E are the same in this alternative method, and so they are not shown again. As shown in FIG. 4A, after the gate oxide layer 40 is deposited on the exposed silicon substrate 30 and epitaxial layers 38, a thin doped polysilicon layer 43A is deposited on the gate oxide layer 40, followed by a thicker, low-resistance conductive layer 46A, such as Tungsten. Then, the conductive layer 46A is planarized by a chemical mechanical polishing (CMP) process. Accordingly, as illustrated in the first and second embodiments, the CMP process may be performed after depositing the gate electrode layer 43, or may be performed after depositing a conductive layer 46A having a low resistance. The remainder of the process steps are the same as in the first embodiment.

Accordingly, as shown in FIG. 2J, the FET formed according to the above-described embodiments lies in a groove which is formed by the epitaxial layers and the silicon substrate. The channel region thereby has a non-planar channel structure. That is, the channel region includes a portion in which the gate electrode overlaps the epitaxial layers grown on the silicon substrate and also includes a portion in which the gate electrode overlaps the silicon substrate. The length of the channel is the sum of the lengths of the curved portions 62 and 64 between the source/drain regions 52 and the substrate 30, and the length of the portion 60 between the epitaxial layers 38. Thus, where the widths of the gate electrodes are kept equal, the length of the channel region of the device of FIG. 2J is greater than the length of the channel region for a conventional device in which the gate electrodes only overlap only the flat silicon substrate.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed is:

1. A method for manufacturing a semiconductor device, comprising:

selectively growing first and second epitaxial layers over a surface of a semiconductor substrate, wherein the first and second epitaxial layers are selectively grown so as to be spaced apart over the surface of the semiconductor substrate;

forming a gate insulating layer over at least a portion of the first and second epitaxial layers and the surface of the semiconductor substrate;

forming a gate electrode over the gate insulating layer such that the gate electrode extends within a gap defined between the first and second epitaxial layers and partially overlaps each of the first and second epitaxial layers adjacent the gap; and forming first and second impurity regions within the first and second epitaxial layers, respectively.

2. The method of claim 1, wherein said selectively growing first and second epitaxial layers over a surface of a semiconductor substrate comprises:

depositing a sacrificial oxide layer on the substrate;

patterning the sacrificial oxide layer to expose portions of the substrate; and growing the first and second epitaxial layers on the exposed portions of the substrate.

3. The method of claim 2, further comprising removing the sacrificial oxide layer after growing the first and second epitaxial layers on the exposed portions of the substrate.

4. The method of claim 1, wherein said forming first and second impurity regions comprises:

conducting a first ion implantation in the first and second epitaxial layers using the gate electrode as a mask;

forming spacers on sides of the gate electrode which respectively overlap portions of the first and second epitaxial layers; and conducting a second ion implantation in the first and second epitaxial layers using the spacers as a mask.

5. The method of claim 1, wherein forming the gate electrode comprises:

depositing a polysilicon layer over the gate insulating layer;

depositing a metal layer over the polysilicon layer; and planarizing an upper surface of the metal layer.

6. The method of claim 5, wherein the upper surface of the metal layer is planarized by a chemical mechanical polish (CMP).

7. The method of claim 1, wherein forming the gate electrode comprises:

depositing a polysilicon layer over the gate insulating layer;

planarizing an upper surface of the polysilicon layer; and depositing a metal layer over the planarized upper surface of the polysilicon layer.

8. The method of claim 7, wherein the upper surface of the polysilicon layer is planarized by a chemical mechanical polish (CMP).

* * * * *